(12) United States Patent
Murphy et al.

(10) Patent No.: US 8,506,104 B1
(45) Date of Patent: Aug. 13, 2013

(54) PHOSPHORS FOR LED LAMPS

(75) Inventors: James Edward Murphy, Niskayuna, NY (US); Satya Kishore Manepalli, Bangalore (IN); Prasanth Nammalwar Kumar, Bangalore (IN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/432,461

(22) Filed: Mar. 28, 2012

(51) Int. Cl.
*F21V 9/16* (2006.01)

(52) U.S. Cl.
USPC ..................................... 362/84; 252/301.4 F

(58) Field of Classification Search
USPC .......................................................... 362/84
See application file for complete search history.

(56) References Cited

U.S. PATENT DOCUMENTS

| | | | |
|---|---|---|---|
| 6,680,569 B2 | 1/2004 | Mueller-Mach et al. |
| 7,094,362 B2 | 8/2006 | Setlur et al. |
| 7,189,340 B2 | 3/2007 | Shimomura et al. |
| 7,648,649 B2 | 1/2010 | Radkov et al. |
| 7,713,441 B2 | 5/2010 | Shimomura et al. |
| 7,790,058 B2 | 9/2010 | Shimomura et al. |
| 8,013,506 B2 | 9/2011 | Bukesov et al. |
| 2008/0138268 A1 | 6/2008 | Tao et al. |
| 2009/0066230 A1 | 3/2009 | Hirosaki et al. |
| 2009/0085467 A1 | 4/2009 | Jang et al. |
| 2011/0279016 A1 | 11/2011 | Li et al. |
| 2011/0298387 A1 | 12/2011 | Kaneda et al. |

OTHER PUBLICATIONS

Setlur et al., "Crystal Chemistry and Luminescence of Ce3+-Doped Lu2CaMg2(Si,Ge)3O12 and Its Use in LED Based Lighting", American Chemical Society, Chem. Mater 2006, vol. 18, pp. 3314-3322.

Nakanishi et al., "Novel Eu2+-Activated Glass Ceramics Precipitated With Green and Red Phosphors for High-Power White LED", IEEE Journal of Selected Topics in Quantum Electronics, 2009, 6 Pages.

*Primary Examiner* — Mary Ellen Bowman
(74) *Attorney, Agent, or Firm* — Mary Louise Stanford

(57) ABSTRACT

A phosphor, a phosphor blend including the phosphor, a phosphor prepared by a process, and a lighting apparatus including the phosphor blend are disclosed. The phosphor has the formula $(Ca_{1-p-q}Ce_pK_q)_xSc_y(Si_{1-r}Ga_r)_zO_{12+\delta}$ or derived from a process followed using disclosed amounts of reactants. In the formula, ($0<p\leq0.06$); $0\leq q\leq0.06$; $0\leq r\leq0.2$; and $-0.1\leq\delta\leq0.4$. In one embodiment, $3<x\leq3.1$; $2\leq y\leq2.15$; and $3\leq z\leq3.2$. Similarly, in another embodiment, $3\leq x\leq3.1$; $2<y\leq2.15$; and $2.8\leq z\leq3.2$.

24 Claims, 1 Drawing Sheet

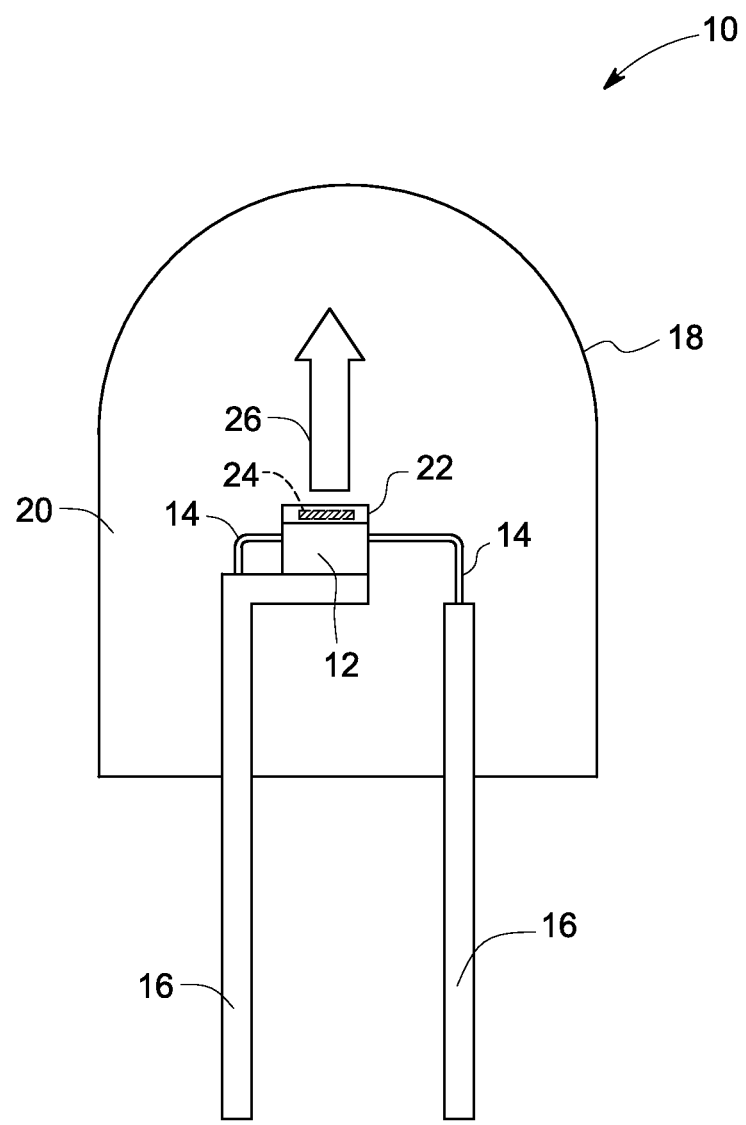

PHOSPHORS FOR LED LAMPS

STATEMENT REGARDING FEDERALLY SPONSORED RESEARCH & DEVELOPMENT

This invention was made with Government support under contract number DE-EE003251 awarded by the United States Department of Energy. The Government may have certain rights in the invention.

BACKGROUND

Generally the present invention relates to phosphor compositions. More particularly, the present invention relates to off stoichiometric garnet phosphors having enhanced emissions in defined spectral regions compared to conventional garnet phosphors.

Light emitting diodes (LEDs) are semiconductor light emitters often used as a replacement for other light sources, such as incandescent lamps. The color of light produced by an LED is dependent on the type of semiconducting material used in its manufacture. Colored semiconductor light emitting devices, including light emitting diodes and lasers (both are generally referred to herein as LEDs), have been produced from Group III-V alloys such as gallium nitride (GaN). In the GaN-based LEDs, light is generally emitted in the UV and/or blue range of the electromagnetic spectrum.

In one technique of converting the light emitted from LEDs to useful light, the LED is coated or covered with a phosphor layer. Some phosphors emit radiation in the visible portion of the electromagnetic spectrum in response to excitation by electromagnetic radiation outside the visible range.

By interposing a phosphor excited by the radiation generated by the LED, light of different wavelengths in the visible range of the spectrum may be generated. Colored LEDs are often in demand to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

Phosphor blends utilizing deep red phosphors are sometimes used to produce light sources having a high color rendering index (CRI). While effective, such phosphors may reabsorb emission from other phosphors that may be present in the illumination device. Thus, a need exists for a new phosphor having a red emission for use in LEDs displaying high quantum efficiency (QE) to produce both colored and white-light LEDs having a high CRI.

Another potential method to enhance the CRI of a lighting source using a blue or UV LED to excite a phosphor is to enhance the emission of the device in the blue-green region. Thus, a need exists for a phosphor having enhanced spectral output in this region when excited by blue or UV light.

BRIEF DESCRIPTION

In one embodiment, a phosphor is disclosed. The phosphor has a nominal formula $(Ca_{1-p-q}Ce_pK_q)_xSc_y(Si_{1-r}Ga_r)_zO_{12+\delta}$. In the formula, p is greater than zero and less than or equal to 0.06 ($0<p\leq0.06$); q is equal to or greater than zero and less than or equal to 0.06 ($0\leq q\leq0.06$); r is equal to or greater than zero and less than or equal to 0.2 ($0\leq r\leq0.2$); and $\delta$ is greater than or equal to ($-0.1$) and less than or equal to 0.4 ($-0.1\leq\delta\leq0.4$). In one embodiment, x is greater than 3 and less than or equal to 3.1 ($3<x\leq3.1$); y is greater than or equal to 2 and less than or equal to 2.15 ($2\leq y\leq2.15$); and z is greater than or equal to 3 and less than or equal to 3.2 ($3\leq z\leq3.2$). Similarly, in one embodiment, x is greater than or equal to 3 and less than or equal to 3.1 ($3\leq x\leq3.1$); y is greater than 2 and less than or equal to 2.15 ($2<y\leq2.15$); and z is greater than or equal to 2.8 and less than or equal to 3.2 ($2.8\leq z\leq3.2$).

In one embodiment, a phosphor blend is disclosed. The blend includes a phosphor of the nominal formula $(Ca_{1-p-q}Ce_pK_q)_xSc_y(Si_{1-r}Ga_r)_zO_{12+\delta}$. In the formula, p is greater than zero and less than or equal to 0.06 ($0<p\leq0.06$); q is equal to or greater than zero and less than or equal to 0.06 ($0\leq q\leq0.06$); r is equal to or greater than zero and less than or equal to 0.2 ($0\leq r\leq0.2$); and $\delta$ is greater than or equal to ($-0.1$) and less than or equal to 0.4 ($-0.1\leq\delta\leq0.4$). In one embodiment, x is greater than 3 and less than or equal to 3.1 ($3<x\leq3.1$); y is greater than or equal to 2 and less than or equal to 2.15 ($2\leq y\leq2.15$); and z is greater than or equal to 3 and less than or equal to 3.2 ($3\leq z\leq3.2$). Similarly, in one embodiment, x is greater than or equal to 3 and less than or equal to 3.1 ($3\leq x\leq3.1$); y is greater than 2 and less than or equal to 2.15 ($2<y\leq2.15$); and z is greater than or equal to 2.8 and less than or equal to 3.2 ($2.8\leq z\leq3.2$).

In one embodiment, a lighting apparatus capable of emitting white light is disclosed. The lighting apparatus includes a semiconductor light source; and a phosphor blend radiationally coupled to the light source. The phosphor blend includes a phosphor of formula $(Ca_{1-p-q}Ce_pK_q)_xSc_y(Si_{1-r}Ga_r)_zO_{12+\delta}$. In the formula, p is greater than zero and less than or equal to 0.06 ($0<p\leq0.06$); q is equal to or greater than zero and less than or equal to 0.06 ($0\leq q\leq0.06$); r is equal to or greater than zero and less than or equal to 0.2 ($0\leq r\leq0.2$); and $\delta$ is greater than or equal to ($-0.1$) and less than or equal to 0.4 ($-0.1\leq\delta\leq0.4$). In one embodiment, x is greater than 3 and less than or equal to 3.1 ($3<x\leq3.1$); y is greater than or equal to 2 and less than or equal to 2.15 ($2\leq y\leq2.15$); and z is greater than or equal to 3 and less than or equal to 3.2 ($3\leq z\leq3.2$). Similarly, in one embodiment, x is greater than or equal to 3 and less than or equal to 3.1 ($3\leq x\leq3.1$); y is greater than 2 and less than or equal to 2.15 ($2<y\leq2.15$); and z is greater than or equal to 2.8 and less than or equal to 3.2 ($2.8\leq z\leq3.2$).

In one embodiment, a phosphor derived from combining raw materials, and blending them together is disclosed. The raw materials include from about 2.91 moles to about 2.95 of calcium; from about 0.001 moles to about 0.2 moles of cerium; from about 1.8 moles to about 2.2 moles of scandium; and from about 2.8 moles to about 3.2 moles of silicon.

DRAWINGS

These and other features, aspects, and advantages of the present invention will become better understood when the following detailed description is read with reference to the accompanying drawing, wherein:

FIG. 1 is a schematic cross-sectional view of a lighting apparatus according to one embodiment of the present invention.

DETAILED DESCRIPTION

Phosphors convert radiation energy to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor as well as a blend of two or more phosphors.

An LED lamp that produces a bright-white light would be useful to impart desirable qualities to LEDs as light sources. Therefore, in one embodiment of the invention, a luminescent material blend (phosphor blend) coated LED is disclosed for providing white light. The individual phosphors and a phosphor blend including the individual phosphors convert radiation at a specified wavelength, for example radiation from about 250 to 550 nm as emitted by a near UV or blue LED, into visible light. The visible light provided by the phosphor blend comprises a bright white light with high intensity and brightness.

With reference to FIG. 1, a lighting apparatus or light emitting assembly or lamp 10 is shown in accordance with one embodiment of the present invention. Lighting apparatus 10 comprises a semiconductor UV radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any semiconductor blue or UV light source that is capable of producing white light when its emitted radiation is directed onto the phosphor. In one embodiment, the semiconductor light source comprises a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe, or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. Preferably, the chip is a near-UV or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by another radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin, silicone or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a material 22 including a phosphor composition 24 (described below). Alternately, the lamp 10 may only comprise an encapsulant material without an outer shell 18. The LED chip 12 may be supported, for example, by the lead frame 16, by the self-supporting electrodes, the bottom of the shell 18, or by a pedestal (not shown) mounted to the shell or to the lead frame. In some embodiments, the LED chip 12 is mounted in a reflective cup (not shown). The cup may be made from or coated with a reflective material, such as alumina, titania, or other dielectric powder known in the art. An example of a reflective material is $Al_2O_3$.

In other embodiments, the phosphor blend 22 is interspersed within the encapsulant material 20, instead of being formed directly on the LED chip 12. The phosphor (in the form of a powder) may be interspersed within a single region of the encapsulant material 20 or, more preferably, throughout the entire volume of the encapsulant material. Blue light emitted by the LED chip 12 mixes with the light emitted by the phosphor blend 22 including the phosphor composition 24, and the mixed light appears as white light. If the phosphor is to be interspersed within the material of encapsulant 20, then a phosphor powder may be added to a polymer precursor, loaded around the LED chip 12, and then the polymer precursor may be cured to solidify the polymer material. Other known phosphor interspersion methods may also be used, such as transfer loading.

In yet another embodiment, phosphor blend 22 including the phosphor composition 24 is coated onto a surface of the shell 18, instead of being formed over the LED chip 12. The phosphor composition is preferably coated on the inside surface of the shell 18, although the phosphor may be coated on the outside surface of the shell, if desired. The phosphor blend 22 including the phosphor composition 24 may be coated on the entire surface of the shell or only a top portion of the surface of the shell. The UV light emitted by the LED chip 12 mixes with the light emitted by the phosphor blend 22 including the phosphor composition 24, and the mixed light appears as white light. Of course, the phosphor may be located in any two or all three locations or in any other suitable location, such as separately from the shell or integrated into the LED.

Lighting apparatus 10 includes the phosphor blend 22 including the phosphor composition 24 described below, radiationally coupled to the LED chip 12. As used herein radiationally coupled means that the elements are associated with each other so that the radiation from one is transmitted to the other. Phosphor blend 22 may be deposited on the LED 12 by any appropriate method. For example, a water-based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor blend 22 and LED 12. Thus, the phosphor blend 22 may be coated over or directly on the light emitting surface of the LED chip 12 by coating and drying the phosphor suspension over the LED chip 12. Both the shell 18 and the encapsulant 20 may be transparent to allow white light 26 to be transmitted through those elements.

In one embodiment, the phosphor 24 comprises a plurality of particles. Although not intended to be limiting, in one embodiment, the median particle size of the phosphor composition 24 as measured by light scattering may be from about 0.1 microns to about 80 microns. Particle size distribution (PSD), and particle size span of the phosphor particles may be influential in the light emitting function of a phosphor material. The PSD of a powder is a list of values that defines the relative amounts of particles present, sorted according to the particle sizes. The distribution of particle sizes are sometimes measured in $D_n$ values, such as, for example $D_{10}$, $D_{50}$, $D_{90}$. $D_{10}$ typically means that in the plurality of particles, 10% of the particles are smaller than the $D_{10}$ value, and 90% of the particles are larger. Similarly $D_{90}$ means that, in the plurality of particles, 90% of the particles are smaller than the $D_{90}$ value, and 10% of the particles are larger. Thus, $D_{50}$ may be taken as a median of the particle sizes of the plurality of particles. Particle size span is a measure of the width of the particle size distribution. In the present invention, the particle size span is measured as below:

$$\text{Span} = (D_{90} - D_{10})/D_{50} \quad (1)$$

A small span indicates a narrow size distribution and a wider span indicates that wide range of particle sizes that are present in a measurement lot.

In one embodiment of the invention, the $D_{10}$ of the plurality of phosphor particles is at least about 5 microns. In one embodiment, removing fine particles with size less than about 5 microns is found to be advantageous for increasing brightness of the phosphor plaques. In one embodiment, the $D_{90}$ of the plurality of phosphor particles is less than about 50 microns, and the $D_{50}$ of the of the phosphor particles in the phosphor blend 22 is less than 25 microns. In one embodiment, the $D_{50}$ of the of the phosphor particles in the phosphor blend 22 is in the range from about 10 microns to about 20 microns. In one embodiment, decreasing the particle size span less than about 2 is found to be advantageous for increasing brightness of the phosphor.

In one embodiment, the phosphor blend 22 of the light emitting apparatus includes a phosphor composition 24, which may be used in above described lighting apparatus 10. In one embodiment, the phosphor composition 24 is calcium site rich, or scandium site rich composition compared to the original phosphor having the general formula $(Ca_{1-p}Ce_p)_3Sc_2Si_3O_{12}$. The family of compositions with calcium, scandium, and silicon with the garnet structure as in $(Ca_{1-p}Ce_p)_3Sc_2Si_3O_{12}$ are generally known as CaSiG. Thus, in one embodiment, the phosphor composition of the present invention is of the formula $(Ca_{1-p-q}Ce_pK_q)_xSc_y(Si_{1-r}Ga_r)_zO_{12+\delta}$. As used herein, the representation $(Ca_{1-p-q}Ce_pK_q)_xSc_y(Si_{1-r}Ga_r)_zO_{12+\delta}$ is a theoretical formula including the mixtures and compounds that are in the specified ratio to be denoted by this formula, and does not necessarily mean that a single compound exists in a form that can be identified by standard characterization techniques. In short, a material specified by the above formula may actually exist as multiple phases which, taken collectively, has an overall composition as specified by the formula. The theoretical formula (nominal composition) may be arrived at by the ratios of the raw material blends used for producing the phosphor composition 24. For example, the raw material blends of 2.91 moles of $CaCO_3$, 0.09 moles of $CeO_2$, 1.04 moles of $Sc_2O_3$, and 2.88 moles of $SiO_2$ were blended and processed for producing a nominal composition of $Ca_{29.1}Ce_{0.09}Sc_{2.08}Si_{2.88}O_{11.925}$ and 2.95 moles of $CaCO_3$, 0.09 moles of $CeO_2$, 1 mole of $Sc_2O_3$, and 3 moles of $SiO_2$ were blended and processed for producing a nominal composition of $Ca_{2.95}Ce_{0.09}Sc_2Si_3O_{12.085}$. A person skilled in the art would be able to appreciate that a calculated extra amount of certain reactants may have to be selected to compensate for loss on Ignition (LOI).

In the phosphor composition 24, Ce representing cerium is the activator of the phosphor in the calcium site in the garnet structure, and potassium is an optional co-dopant. The amount of doping of cerium is denoted by the letter p and the potassium doping is denoted by the letter q. In one embodiment, p is greater than zero and less than or equal to 0.06 ($0 < p \leq 0.06$); q is equal to or greater than zero and less than or equal to 0.06 ($0 \leq q \leq 0.06$). In one particular embodiment, q is greater than zero, and in a further embodiment, q is equal to or greater than 0.001. In one specific embodiment, p is equal to q (p=q).

As used herein, the term 'greater than zero' denotes that the intended component is intentionally added, rather than an incidental amount that may be present as an impurity. As used herein, end points of the ranges include incidental variations above and below the stated number, as appropriate for normal measurement and process variations.

In one embodiment, the potassium and/or gallium along with an activator such as cerium is observed to maintain overall charge neutrality of the phosphor composition. Apart from maintaining the change neutrality, the dopants may also help in color tuning of the phosphor for a desired application.

The amount of gallium dopant in the silicon site in the phosphor composition 24 is decided by r. In one embodiment, r is equal to or greater than zero and less than or equal to 0.2 ($0 \leq r \leq 0.2$). In a particular embodiment, r is greater than zero.

The amount of calcium along with the dopants sharing the calcium site in the phosphor composition 24 is decided by x. In one embodiment, x may be varying between 3 and 3.1. The amount of silicon along with the optional gallium dopant is decided by z. In one embodiment, z may be varying between 2.8 and 3.2. δ represents the deviation in the oxygen amount from oxygen value (12) of the garnet structured phosphor composition $(Ca_{1-p}Ce_p)_3Sc_2Si_3O_{12}$. δ varies depending on the amount of calcium (along with the optional dopants), scandium, and silicon (along with the optional dopant gallium) present in the phosphor composition 24. δ may vary from about (−0.1) and about 0.4, depending on the values of x, y, and z.

In one embodiment, the amount of elements in the calcium site taken in the initial blend is more than that required for the CaSiG composition $(Ca_{1-p}Ce_p)_3Sc_2Si_3O_{12}$. In one embodiment, the amount of elements in the calcium site in the phosphor composition is more than that in the CaSiG composition $(Ca_{1-p}Ce_p)_3Sc_2Si_3O_{12}$. Thus, x is greater than 3. When x is greater than 3, and y and z are equal to or greater than their respective stoichiometric value (in this case 2 and 3 respectively for y and z), δ becomes greater than zero. In one embodiment, δ is greater than zero and less than or equal to 0.4 ($0 < \delta \leq 0.4$). In a specific embodiment, δ is greater than zero and less than or equal to 0.4 ($0 < \delta \leq 0.4$) when x is greater than 3 and less than or equal to 3.1 ($3 < x \leq 3.1$); y is greater than or equal to 2 and less than or equal to 2.15 ($2 \leq y \leq 2.15$); and z is greater than or equal to 3 and less than or equal to 3.2 ($3 \leq z \leq 3.2$). In a specific example, δ is greater than zero and less than or equal to 0.2 ($0 < \delta \leq 0.2$) when x is greater than 3 and less than or equal to 3.1 ($3 < x \leq 3.1$); y is greater than or equal to 2 and less than or equal to 2.1 ($2 \leq y \leq 2.1$); and z is greater than or equal to 3 and less than or equal to 3.1 ($3 \leq z \leq 3.1$). Thus, this specific phosphor composition 24 is a calcium-site rich, off stoichiometric formula. In one embodiment, the phosphor composition 24 is blended as a calcium-site rich blend. The calcium-site rich phosphor composition 24 showed an improved brightness relative to the CaSiG composition, $(Ca_{1-p}Ce_p)_3Sc_2Si_3O_{12}$.

In one embodiment, the scandium concentration initially blended to make the phosphor composition 24 is more than that in the CaSiG formula $(Ca_{1-p}Ce_p)_3Sc_2Si_3O_{12}$. In one embodiment, the scandium concentration present in the phosphor composition 24 is more than that in the CaSiG formula $(Ca_{1-p}Ce_p)_3Sc_2Si_3O_{12}$. Thus, y is greater than 2. When y is greater than 2, x may be greater than or equal to 3 and less than or equal to 3.1 ($3 \leq x \leq 3.1$). When y is greater than 2, the amount of silicon, including the dopant may be equivalent, less, or greater than the stoichiometric value of 3. Thus, when y is greater than 2, z may vary between 2.8 and 3.2. In a specific embodiment, $\delta$ is greater than or equal to $(-0.1)$ and less than or equal to 0.4 ($-0.1 \leq \delta \leq 0.4$), when y is greater than 2 and less than or equal to 2.15 ($2 \leq y \leq 2.15$); and z is greater than or equal to 2.8 and less than or equal to 3.2 ($2.8 \leq z \leq 3.2$). In a specific example, $\delta$ is greater than or equal to $(-0.1)$ and less than or equal to 0.1 ($-0.1 \leq \delta \leq 0.1$), when y is greater than 2 and less than or equal to 2.1 ($2 < y \leq 2.1$); and z is greater than or equal to 2.8 and less than or equal to 3.1 ($2.8 \leq z \leq 3.1$). The scandium site rich phosphor composition 24 was experimentally found to be increasing the brightness of the light output as compared to the CaSiG composition, $(Ca_{1-p}Ce_p)_3Sc_2Si_3O_{12}$.

Further, in a non-limiting example, $\delta$ is greater than or equal to $(-0.1)$ and less than or equal to 0.4 ($-0.1 \leq \delta \leq 0.4$), when y is greater than 2 and less than or equal to 2.15 ($2 < y \leq 2.15$); and z is greater than or equal to 2.8 and less than 3. In another non-limiting example, $\delta$ is greater than or equal to $(-0.1)$ and less than or equal to 0.4 ($-0.1 \leq \delta \leq 0.4$), when y is greater than 2 and less than or equal to 2.15 ($2 < y \leq 2.15$); and z is greater than 3 and less than or equal to 3.2. In one particular embodiment, x>3, y>2, and z=3. In another, particular embodiment, x>3, y>2, and z<3.

In one embodiment, the LED preferably has a primary emission in the region of about 250 to 500 nm. When used with an LED emitting at from 350 to 550 nm and one or more other appropriate phosphors, the resulting lighting system will produce a light having a white color, the characteristics of which will be discussed in more detail below. Lamp 10 may also include scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

The phosphor blend 22 including the phosphor described above may contain optically inert trace impurities. The presence of such impurities in an amount up to 10% by weight of the phosphor composition will not significantly affect the quantum efficiency or color of the phosphor.

It may be desirable to add pigments or filters to the phosphor material. The phosphor blend 22 may also comprises from 0 up to about 5% by weight (based on the total weight of the phosphors) of a pigment or other UV absorbent material capable of absorbing UV radiation having a wavelength between 250 nm and 450 nm.

Suitable pigments or filters include any of those known in the art that are capable of absorbing radiation generated between 250 nm and 450 nm. Such pigments include, for example, nickel titanate or praseodymium zirconate. The pigment is used in an amount effective to filter 10% to 100% of the radiation generated in the 250 nm to 450 nm range.

Phosphors described above may be produced using known solid-state reaction methods by combining, for example, elemental oxides, carbonates, and/or hydroxides as starting materials. Other starting materials may include nitrates, sulfates, acetates, citrates, or oxalates. In one embodiment, the phosphor is produced by blending, heating and milling from about 2.91 moles to about 2.95 of calcium; from about 0.001 moles to about 0.2 moles of cerium; from about 1.8 moles to about 2.2 moles of scandium; and from about 2.8 moles to about 3.2 moles of silicon.

As used herein "from about 2.91 moles to about 2.95 of calcium" means any source that will provide the recited moles of calcium ions to the blend. For example, "calcium" may be obtained from a source including calcium oxide, calcium oxalate, calcium acetate, and calcium formate. Similarly "from about 0.001 moles to about 0.2 moles of cerium; from about 1.8 moles to about 2.2 moles of scandium; and from about 2.8 moles to about 3.2 moles of silicon" means that the recited amounts of those ions that are produced by using any source of the respective material. In non-limiting examples, the "cerium" source may be cerium oxide or ammonium cerium nitrate; the "scandium" source may be scandium oxide, and the "silicon" source may be silicon oxide or silicic acid. One skilled in the art would understand that the actual moles of the sources taken will defer depending on the number of moles of the required ions present in the source. For example, "from about 1.8 moles to about 2.2 moles of scandium" may mean taking from about 0.09 moles to about 1.1 moles of $Sc_2O_3$. Further, dopants potassium and gallium may be added to obtain the required phosphor by adding the required amount of potassium and gallium sources respectively that would provide the required moles of respective ion sources. Thus for example from about 0.001 moles to about 0.2 moles of potassium may be added to include potassium in the phosphor composition, and from about 0.001 moles to about 0.2 moles of gallium may be added to include gallium in the phosphor composition.

In one embodiment, coprecipitates of the rare earth oxides are used as the starting materials for the rare earth elements. In a typical process, the starting materials are combined via a dry blending process and fired in air or under a slightly reducing atmosphere at from, e.g., 1000° C. to 1600° C.

The starting materials may be mixed or blended together by any mechanical method including, but not limited to, stirring or blending in a high-speed blender or a ribbon blender. The starting materials may be combined and pulverized together in a ball mill, a hammer mill, or a jet mill. The mixing may be carried out by wet milling in alcohol or organic solvents especially when the mixture of the starting materials is to be made into a solution for subsequent precipitation. If the mixture is wet, in one embodiment, the mixture is dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batch wise or continuous process, sometimes with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen or helium, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

The final phosphor composition obtained may be blended, sieved, or subjected to other treatments to get the required particle sizes, shapes, size distribution and span. In one embodiment, removal of the fine particles via elutriation or even decanting improves the measured quantum efficiency of the phosphor composition 24.

The phosphor blend 22 presented here may be blended with one or more additional phosphors, than the phosphor composition 24 for use in LED light sources. Thus, in another embodiment, an LED lighting apparatus is provided including a phosphor blend 22 including a blend of any of the phosphors described above with one or more additional phosphors.

The relative amounts of each phosphor in a phosphor blend can be described in terms of spectral weight. Spectral weight is the relative amount that each phosphor contributes to the overall emission spectrum of the device. The spectral weight amounts of all the individual phosphors and any residual bleed from the LED source should add up to 1.0 (i.e. 100%). In one embodiment, the above-described phosphor has a spectral weight ranging from about 0.001 to 0.80. Any known blue, blue-green, green, yellow, orange or red phosphor suitable for use in UV or blue LED systems may be used in blends with this phosphor to customize the white color of the resulting light and produce higher CRI sources. While not intended to be limiting, suitable phosphors that can be used in the blend with the present phosphor composition 24 include phosphors such as Blue/Blue-Green
$(Ba,Sr,Ca)_5(PO_4)_3(Cl,F,Br,OH):Eu^{2+},Mn^{2+}$ (SECA)
$(Ba,Sr,Ca)BPO_5:Eu^{2+},Mn^{2+}$
$(Sr,Ca)_{10}(PO_4)_6 \cdot vB_2O_3:Eu^{2+}$ (wherein $0 \leq v \leq 1$)
$Sr_2Si_3O_8 \cdot 2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO \cdot 0.84P_2O_5 \cdot 0.16B_2O_3:Eu^{2+}$
$(Sr,Ca,Ba)_4Al_{14}O_{25}:Eu^{2+}$ (SAE)
$(Ba,Sr,Ca)MgAl_{10}O_{17}:Eu^{2+},Mn^{2+}$ Green/Yellow-Green
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2Si_{1-\xi}O_{4-2\xi}:Eu^{2+}$ (wherein $0 \leq \xi \leq 0.2$) (SASI)
$(Ba,Sr,Ca)_2(Mg,Zn)Si_2O_7:Eu^{2+}$
$(Sr,Ca,Ba)(Al,Ga,In)_2S_4:Eu^{2+}$
$(Sr,Ca,Ba)_3Al_{1-x}Si_xO_{4+x}F_{1-x}:Ce^{3+}$ (SASOF)
$(Y,Gd,Tb,La,Sm,Pr,Lu)_3(Sc,Al,Ga)_{5-\alpha}O_{12-3/2\alpha}:Ce^{3+}$ (wherein $0 \leq \alpha \leq 0.5$) (YAG)
$(Lu,Sc,Y,Tb)_{2-u-v}Ce_vCa_{1+u}Li_wMg_{2-w}P_w(Si,Ge)_{3-v}O_{12-u/2}$ where $-0.5 \leq u \leq 1$; $0 \leq v \leq 0.1$; and $0 \leq w \leq 0.2$ (LuSi)
$(Ca,Ba,Sr)Si_2O_2N_2:Eu^{2+},Ce^{3+}$
$Ba_4Si_9O_xN_y:Eu^{2+}$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$ Orange/Red
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_\beta Si_\gamma N_\mu:Eu^{2+},Ce^{3+}$ (wherein $2\beta + 4\gamma = 3\mu$)
$Ca_3(SiO_4)Cl_2:Eu^{2+}$
$(Y,Lu,Gd)_{2-\phi Ca\phi}Si_4N_{6+\phi}C_{1-\phi}:Ce^{3+}$, (wherein $0 \leq \phi \leq 0.5$)
$(Lu,Ca,Li,Mg,Y)alpha-SiAlON:Eu^{2+},Ce^{3+}$
$3.5MgO \cdot 0.5MgF_2 \cdot GeO_2:Mn^{4+}$ (MFG)
$Ca_{1-c-f}Ce_cEu_fAl_{1+c}Si_{1-c}N_3$, (where $0<c \leq 0.2$, $0 \leq f \leq 0.2$)
$Ca_{1-h-r}Ce_hEu_rAl_{1-h}(Mg,Zn)_hSiN_3$, (where $0<h \leq 0.2$, $0 \leq r \leq 0.2$)
$Ca_{1-2s-t}Ce_s(Li,Na)_sEu_tAlSiN_3$, (where $0 \leq s \leq 0.2$, $0 \leq f \leq 0.2$, $s+t>0$)
$Ca_{1-\sigma-\chi-\phi}Ce_\sigma(Li,Na)_\chi Eu_\phi Al_{1+\sigma+\chi}Si_{1-\sigma+\chi}N_3$, (where $0 \leq \sigma \leq 0.2$, $0<\chi \leq 0.4$, $0 \leq \phi \leq 0.2$)
Complex fluorides doped with $Mn^{4+}$, such as $(Na,K,Rb,Cs,NH_4)_2(Ti,Ge,Sn,Si,Zr,Hf)F_6:Mn^{4+}$.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, possess an x value in the range of about 0.30 to about 0.55, and a y value in the range of about 0.30 to about 0.55. As stated, however, the exact identity and amounts of each phosphor in the phosphor composition can be varied according to the needs of the end user. When combined with a LED emitting at from 350-550 nm and, optionally, one or more additional phosphors, the use of the phosphor material described above allows for a white LED device having a higher CRI value and lower CCT as compared to a YAG based lighting device. LED devices having CCT values from about 2500 to about 10000, preferably from 2500 to 4500, and high CRI values from about 70 to 99 can be made.

For example, when using 405 nm LEDs these phosphors described above can be combined with a combination of phosphors that can include blue, blue-green, and red phosphors to make white light with CCT values ranging from 2500-10000 K and CRIs ranging from 70-99. One example of such a blend would be the phosphor described above in combination with the SECA blue phosphor, the SAE blue-green phosphor, and the MFG red phosphor. Alternatively, the phosphor composition described above can also be used in combination with 430-450 nm LEDs and appropriate phosphor blends using a combination of phosphors that can include green, yellow-green and red phosphors. One example of such a blend would be the phosphor described above in combination with a green/yellow-green phosphor such as SASOF, YAG, or LuSi and a complex fluoride doped with $Mn^{4+}$, such as $(Na,K,Rb,Cs,NH_4)_2(Ti,Ge,Sn,Si,Zr,Hf)F_6:Mn^{4+}$.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive.

EXAMPLES

The following examples illustrate methods, materials and results, in accordance with specific embodiments, and as such should not be construed as imposing limitations upon the claims. All components are commercially available from common chemical suppliers.

Example 1

Nominal compositions of phosphors were made starting from high purity raw materials. For example, $Ca_{2.91}Ce_{0.09}Sc_2Si_3O_{12}$ was synthesized using 2.91 moles $CaCO_3$, 0.09 moles $CeO_2$, 1 mole of $Sc_2O_3$, 3 moles of $SiO_2$. LOI (Loss of ignition) was accounted for in the weight of raw materials. Precursors were dry mixed for about 3 hours using YSZ media in a nalgene bottle. Later, raw mix was transferred to an alumina crucible and fired twice at 1400° C. for about 5 h in 1% $H_2$—$N_2$ gas. The fired product was crushed using mortar & pestle and sieved through a 170 mesh. Different nominal compositions with excess & low quantities of Sc, Si and Ca were synthesized. Table 1 below summarizes the plaque brightness values of these compositions. Two processes were found to increase the plaque brightness of CaSiG relative to the earlier known process. The improved processes involve adding a slight excess of a Ca raw material or adding a slight excess of scandium and a lower Si content relative to the standard process.

TABLE 1

| Sample | Ca (mol) | Ce (mol) | Sc (mol) | Si (mol) | Plaque brightness (%) |
|---|---|---|---|---|---|
| 1 | 2.91 | 0.09 | 2 | 3 | 72 |
| 2 | 2.91 | 0.09 | 1.92 | 2.88 | 68 |
| 3 | 2.91 | 0.09 | 2.08 | 3.12 | 60 |
| 4 | 2.91 | 0.09 | 1.92 | 3.12 | 52 |
| 5 | 2.91 | 0.09 | 2.08 | 2.88 | 76 |
| 6 | 2.95 | 0.09 | 2 | 3 | 75 |
| 7 | 2.87 | 0.09 | 2 | 3 | 69 |
| 8 | 3 | 0.09 | 2 | 3 | 68 |

Example 2

In the following study, along with the effect of the additional calcium and scandium in the phosphor samples, the effect of temperature of firing and the removal of fines (fine particles) on QE were measured. First firing of the sample was done at 1400° C. (code-1F) and second firing was done at 1425° C. (code-2F). In both the experiments, products were crushed and ground using mortar & pestle. Fine particles from these samples were removed by dispersing phosphor powder in water and stirring it for about 10 min. Powder was allowed to settle down for about 30 min and then the supernatant solution containing fine phosphor particles were removed. Table 2 below shows the QE and absorbance values of different off stoichiometric CASIG compositions with respect to CaSiG sample ($Ca_{2.91}Ce_{0.09}Sc_2Si_3O_{12}$).

TABLE 2

Nominal starting stoichiometry and firing temperature effects on quantum efficiency of CaSiG phosphor.

| | Abs. | QE | d10/d50/d90 | Span |
|---|---|---|---|---|
| $Ca_{2.91}Ce_{.09}Sc_{2.08}Si_{2.88}O_{11.685}$-1F | 78% | 106% | 5.5/16.5/33 | 1.67 |
| $Ca_{2.91}Ce_{.09}Sc_{2.08}Si_{2.88}O_{11.685}$-2F | 79% | 104% | 6.1/16.6/31.9 | 1.55 |
| $Ca_{2.95}Ce_{.09}Sc_2Si_3O_{12.085}$-1F | 75% | 107% | 5.3/16.7/35.3 | 1.80 |
| $Ca_{2.95}Ce_{.09}Sc_2Si_3O_{12.85}$-2F | 77% | 111% | 9.1/20.9/38.6 | 1.41 |
| $Ca_{2.95}Ce_{.09}Sc_2Si_{2.9}O_{11.845}$-1F | 74% | 108% | 4.6/13.5/26.6 | 1.63 |
| $Ca_{2.95}Ce_{.09}Sc_2Si_{2.9}O_{11.845}$-2F | 79% | 106% | 9.3/20.3/36.7 | 1.35 |
| $Ca_{2.91}Ce_{.09}Sc_2Si_3O_{12}$-1F | 72% | 101% | 4.9/15.4/31.4 | 1.72 |
| $Ca_{2.91}Ce_{.09}Sc_2Si_3O_{12}$-2F | 77% | 104% | 8.5/19.1/34.6 | 1.37 |
| CaSiG $Ca_{2.91}Ce_{0.09}Sc_2Si_3O_{12}$ | 69% | 100% | 2.0/17.3/44.9 | 2.48 |

It can be seen that, the phosphor compositions with a slight variation from the CaSiG composition showed higher QE than the control sample. Further, it was seen that, the phosphor compositions with a slight variation in the initially blended material from the CaSiG composition showed higher QE than the control sample. Higher firing temp (1425° C.) was found to increase absorption (Abs) and particle size.

Example 3

$(Ca_{1-2x}Ce_xK_x)_3Sc_2Si_3O_{12}$ (x=0.03, 0.5) compositions were synthesized from stoichiometric amounts of $CaCO_3$, $CeO_2$, $K_2CO_3$, $Sc_2O_3$ and $SiO_2$. LOI was accounted for in the weight of raw materials. Precursors were dry mixed for about 3 hours using YSZ media in a nalgene bottle. Later, raw mix was transferred to an alumina crucible and fired at 1400° C. for 5 hours in reducing atmosphere. Product was crushed using mortar & pestle and sieved through a 300 mesh. The sieved powder was re-fired at 1450° C. for 5 hours in reducing atmosphere. QE and absorbance values of these phosphors with respect to an internal standard CaSiG phosphor and $BaSO_4$ respectively are given in Table 3.

TABLE 3

| Composition | QE | Abs |
|---|---|---|
| $Ca_{2.86}Ce_{0.09}K_{0.09}Sc_2Si_3O_{12+\delta}$ | 88 | 76 |
| $Ca_{2.74}Ce_{0.15}K_{0.15}Sc_2Si_3O_{12+\delta}$ | 86 | 74 |

Example 4

$Ca_{3-x}Ce_xSc_2Si_{3-x}Ga_xO_{12}$ (x=0.1, 0.2) compositions were synthesized from stoichiometric amounts of $CaCO_3$, $CeO_2$, $Ga_2O_3$, $Sc_2O_3$ and $SiO_2$ taking LOI into account. Precursors were dry mixed for about 3 hours using YSZ media in a nalgene bottle. Later, raw mix was transferred to an alumina crucible and fired at 1400° C. for 5 h in reducing atmosphere. The fired product was crushed using mortar & pestle and sieved through 170 mesh. The powder obtained was re-fired at 1450° C. for 5 hours in reducing atmosphere. QE and absorbance values of these phosphors with respect to an internal standard CaSiG and $BaSO_4$ respectively are given in Table 4.

TABLE 4

| Composition | QE | Abs |
|---|---|---|
| $Ca_{2.94}Ce_{0.1}Sc_2Si_{2.9}Ga_{0.1}O_{12+\delta}$ | 79 | 84 |
| $Ca_{2.94}Ce_{0.2}Sc_2Si_{2.8}Ga_{0.2}O_{12+\delta}$ | 67 | 90 |

Color coordinates for $Ca_{3-x}Ce_xSc_2Si_3Ga_xO_{12}$ (x=0.1, 0.2) compositions are given in Table 5. For comparison, color coordinates of stoichiometric CaSiG were also given. It can be seen that, with Ga substitution we can tune the color of the phosphor for specific color blends.

TABLE 5

| Composition | x | y |
|---|---|---|
| $Ca_{2.94}Ce_{0.1}Sc_2Si_{2.9}Ga_{0.1}O_{12+\delta}$ | 0.3409 | 0.5800 |
| $Ca_{2.94}Ce_{0.2}Sc_2Si_{2.8}Ga_{0.2}O_{12+\delta}$ | 0.3533 | 0.5757 |
| CaSiG $Ca_{2.91}Ce_{0.09}Sc_2Si_3O_{12}$ | 0.3106 | 0.5796 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phosphor of formula $(Ca_{1-p-q}Ce_pK_q)_xSc_y(Si_{1-r}Ga_r)_zO_{12+\delta}$, wherein
   $0<p\leq0.06$; $0\leq q\leq0.06$; $0\leq r\leq0.2$; $-0.1\leq\delta\leq0.4$; and
   (i) $3<x\leq3.1$; $2\leq y\leq2.15$; and $3\leq z\leq3.2$, or
   (ii) $3\leq x\leq3.1$; $2<y\leq2.15$; and $2.8\leq z\leq3.2$.

2. The phosphor of claim 1, wherein the $q\geq0.001$.

3. The phosphor of claim 1, wherein the $p=q$.

4. The phosphor of claim 1, wherein the $r\geq0.001$.

5. The phosphor of claim 1, wherein $-0.1\leq\delta\leq0.4$, when $3\leq x\leq3.1$; $2\leq y\leq2.15$; and $3<z\leq3.2$.

6. The phosphor of claim 1, wherein $-0.1\leq\delta\leq0.4$, when $3\leq x\leq3.1$; $2\leq y\leq2.15$; and $2.8\leq z<3$.

7. The phosphor of claim 1, wherein the phosphor has the formula $Ca_{2.95}Ce_{0.09}Sc_2Si_3O_{12+\delta}$, wherein $\delta>0$.

8. The phosphor of claim 1, wherein the phosphor has the formula $Ca_{2.95}Ce_{0.09}K_{0.09}Sc_2Si_3O_{12+\delta}$, wherein $\delta>0$.

9. The phosphor of claim 1, wherein the phosphor has the formula $Ca_3Ce_{0.09}Sc_{2.08}Si_{2.88}O_{12+\delta}$, wherein $\delta<0$.

10. The phosphor of claim 1, wherein the phosphor comprises a plurality of particles.

11. The phosphor of claim 10, wherein the plurality of particles have a particle size span less than 2.

12. The phosphor of claim 10, wherein a $d_{10}$ of the plurality of particles is at least about 5 microns.

13. The phosphor of claim 10, wherein a $d_{50}$ of the plurality of particles is at least about 15 microns.

14. The phosphor of claim 10, wherein a $d_{90}$ of the plurality of particles is less than about 50 microns.

15. The phosphor of claim 1, wherein a quantum efficiency of the phosphor is greater than the phosphor with the nominal composition $Ca_{2.91}Ce_{0.09}Sc_2Si_3O_{12}$.

16. A phosphor blend comprising:
   a phosphor of formula $(Ca_{1-p-q}Ce_pK_q)_xSc_y(Si_{1-r}Ga_r)_zO_{12+\delta}$, wherein
   $0<p\leq0.06$; $0\leq q\leq0.06$; $0\leq r\leq0.2$; $-0.1\leq\delta\leq0.4$; and
   (i) $3<x\leq3.1$; $2\leq y\leq2.15$; and $3\leq z\leq3.2$, or
   (ii) $3\leq x\leq3.1$; $2<y\leq2.15$; and $2.8\leq z\leq3.2$.

17. The phosphor blend of claim 16, wherein the phosphor has the formula $Ca_{2.95}Ce_{0.09}Sc_2Si_3O_{12+\delta}$, wherein $\delta>0$.

18. The phosphor blend of claim 16, wherein the phosphor has the formula $Ca_{2.95}Ce_{0.09}K_{0.09}Sc_2Si_3O_{12+\delta}$, wherein $\delta>0$.

19. The phosphor blend of claim 16, wherein the phosphor has the formula $Ca_3Ce_{0.09}Sc_{2.88}Si_{2.88}O_{12+\delta}$, wherein $\delta<0$.

20. A lighting apparatus capable of emitting white light, said lighting apparatus comprising:
   a semiconductor light source; and
   a phosphor blend radiationally coupled to the light source, the phosphor blend comprising:
      a phosphor of formula $(Ca_{1-p-q}Ce_pK_q)_xSc_y(Si_{1-r}Ga_r)_zO_{12+\delta}$, wherein
      $0<p\leq0.06$; $0\leq q\leq0.06$; $0\leq r\leq0.2$; $-0.1\leq\delta\leq0.4$; and
      (i) $3<x\leq3.1$; $2\leq y\leq2.15$; and $3\leq z\leq3.2$, or
      (ii) $3\leq x\leq3.1$; $2<y\leq2.15$; and $2.8\leq z\leq3.2$.

21. A phosphor derived from combining
   from about 2.91 moles to about 2.95 of calcium;
   from about 0.001 moles to about 0.2 moles of cerium,
   from about 1.8 moles to about 2.2 moles of scandium,
   from about 2.8 moles to about 3.2 moles of silicon to form a blend.

22. A phosphor according to claim 21, wherein the phosphor is additionally derived from heating the blend to a temperature in a range from about 1200° C. to about 1500° C. in an inert atmosphere comprising about 0.01% to about 4% of hydrogen in nitrogen;
   milling the heated blend; and
   removing fine particles from the milled blend.

23. The phosphor of claim 21, wherein from about 0.001 moles to about 0.2 moles of potassium are additionally combined to form the blend.

24. The phosphor of claim 21, wherein from about 0.001 moles to about 0.2 moles of gallium are additionally combined to form the blend.

* * * * *

UNITED STATES PATENT AND TRADEMARK OFFICE
CERTIFICATE OF CORRECTION

PATENT NO. : 8,506,104 B1  
APPLICATION NO. : 13/432461  
DATED : August 13, 2013  
INVENTOR(S) : Murphy et al.

Page 1 of 1

It is certified that error appears in the above-identified patent and that said Letters Patent is hereby corrected as shown below:

In the Specification

In Column 2, Line 54, delete "DRAWINGS" and insert - - BRIEF DESCRIPTION OF DRAWINGS - -, therefor.

In Column 9, Line 53, delete "$Na_2Gd_2B_2O_2:Ce^{3+},Tb^{3+}$" and insert - - $Na_2Gd_2B_2O_7:Ce^{3+},Tb^{3+}$ - -, therefor.

In Column 9, Line 62, delete "$(Ba,Sr,Ca)MgP_2O_2:Eu^{2+},Mn^{2+}$" and insert - - $(Ba,Sr,Ca)MgP_2O_7:Eu^{2+},Mn^{2+}$ - -, therefor.

In Column 9, Line 66, delete "$(Y,Lu,Gd)_{2-\Phi}Ca_\Phi Si_4N_{6+\Phi}C_{1-\Phi}:Ce^{3+},$" and insert - - $(Y,Lu,Gd)_{2-\Phi}Ca_\Phi Si_4N_{6+\Phi}C_{1-\Phi}:Ce^{3+}$, - -, therefor.

In Column 10, Line 7, delete "$Ca_{1-\sigma-\chi-\Phi}Ce_\sigma(Li,Na)_\chi Eu_\Phi Al_{1+\sigma+\chi}Si_{1-\sigma+\chi}N_3,$" and insert - - $Ca_{1-\sigma-\chi-\Phi}Ce_\sigma(Li,Na)_\chi Eu_\Phi Al_{1+\sigma-\chi}Si_{1-\sigma+\chi}N_3$, - -, therefor.

In Column 12, Line 49, delete "$Ca_{3-x}Ce_xSc_2Si_3,Ga_xO_{12}$" and insert - - $Ca_{3-x}Ce_xSc_2Si_{3-x}Ga_xO_{12}$ - -, therefor.

In the Claims

In Column 13, Line 35, in Claim 16, delete "$(Ca_{1-p-q}Ce_pK_q)_xSc_y(Si_{1-r}Ga_r),$" and insert - - $(Ca_{1-p-q}Ce_pK_q)_xSc_y(Si_{1-r}Ga_r)_z$ - -, therefor.

In Column 14, Line 8, in Claim 19, delete "$Ca_3Ce_{0.09}Sc_{2.88}Si_{2.88}O_{12+\delta},$" and insert - - $Ca_3Ce_{0.09}Sc_{2.08}Si_{2.88}O_{12+\delta}$, - -, therefor.

Signed and Sealed this  
Fifteenth Day of October, 2013

Teresa Stanek Rea  
*Deputy Director of the United States Patent and Trademark Office*